(12) United States Patent
Akaogi

(10) Patent No.: US 7,260,019 B1
(45) Date of Patent: Aug. 21, 2007

(54) MEMORY ARRAY

(75) Inventor: Takao Akaogi, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 128 days.

(21) Appl. No.: 11/262,651

(22) Filed: Oct. 31, 2005

(51) Int. Cl.
G11C 8/00 (2006.01)
G11C 7/00 (2006.01)

(52) U.S. Cl. .................... 365/230.06; 365/63

(58) Field of Classification Search ......... 365/230.06, 365/63, 230.03
See application file for complete search history.

(56) References Cited

U.S. PATENT DOCUMENTS

| 5,691,945 | A | * | 11/1997 | Liou et al. ............ 365/200 |
| 6,788,612 | B2 | * | 9/2004 | Hsu et al. ............ 365/230.05 |
| 6,909,641 | B2 | * | 6/2005 | Naso et al. ........... 365/185.33 |
| 2004/0090825 | A1 | | 5/2004 | Nam et al. ............... 365/185 |

* cited by examiner

Primary Examiner—Son Dinh

(57) ABSTRACT

A memory array includes a plurality of memory banks, each having a plurality of sectors and a plurality of sector decoders, each sector decoder operatively associated with a sector. A first plurality of lines provides first signals, and a second plurality of lines provides second signals. A first decoder apparatus is operatively associated with the first plurality of lines for receiving the first signals and for providing a first address signal by means of a first single line to a sector decoder of a memory bank. A second decoder apparatus is operatively associated with the second plurality of lines for receiving the second signals and for providing a second address signal by means of a second single line to a sector decoder of a memory bank.

20 Claims, 18 Drawing Sheets

MEMORY ARRAY

BACKGROUND OF THE INVENTION

1. Technical Field

This invention relates generally to memory arrays, and more particularly, to sector decoding in such an array.

2. Background Art

FIG. 1 illustrates a flash memory array 50 of the prior art. This memory array 50 includes a plurality of memory banks (shown are banks BA and BB of a large number of memory banks). Each memory bank includes a plurality of sectors arranged in a column. For example memory bank BA includes sectors SA1-SA8 arranged in a column, memory bank BB includes sectors SB1-SB8 arranged in a column, and so forth. These columns of sectors are in parallel relation as illustrated FIG. 1. Each sector is operatively associated with a sector decoder as shown. For example, in memory bank BA, sector decoder SA1D is operatively associated with sector SA1, etc., while in memory bank BB, sector decoder SB1D is operatively associated with sector SB1, etc.

At the bottom of the array 50 are a plurality of read address lines R (including lines R1, R2, R3) and a plurality of write address lines W (including lines W1, W2, W3). The read address lines R1, R2, R3 communicate respectively with lines R1A, R2A, R3A, (which make up the plurality of lines RA), and the lines R1A, R2A, R3A in turn communicate with each of the sector decoders SA1D-SA8D. The read address lines R1, R2, R3 also communicate respectively with lines R1B, R2B, R3B (which make up the plurality of lines RB), and the lines R1A, R2A, R3A in turn communicate with each of the sector decoders SB1D-SB8D. The write address lines W1, W2, W3 communicate respectively with lines W1A, W2A, W3A (which make up the plurality of lines WA), and the lines W1A, W2A, W3A in turn communicate with each of the sector decoders SA1D-SA8D. The write address lines W1, W2, W3 also communicate respectively with lines W1B, W2B, W3B (which make up the plurality of lines WB), and the lines W1A, W2A, W3A in turn communicate with each of the sector decoders SB1D-SB8D. In addition, select decoders are included for selecting a particular memory bank. As illustrated, select decoder BAD has extending therefrom lines WSELA, RSELA which communicate with each of the sector decoders SA1D-SA8D, select BBD has extending therefrom lines WSELB, RSELB which communicate with each of the sector decoders SB1D-SB8D, etc.

It will be understood that while the present embodiment illustrates eight sectors in each bank, along with three read address lines R1, R2, R3 (capable of providing eight digital addresses) and three write address lines W1, W2, W3 (capable providing eight digital addresses), these numbers are chosen for illustrative purposes only and, for example, each bank may include more than eight sectors, for example 16 sectors which would be associated with four read address lines (for providing 16 digital addresses) and four write address lines (for providing 16 digital addresses).

Each of the select decoders BAD, BBD is identical in configuration, and the select decoder BAD is illustrated in FIG. 2. In selecting a bank, an external address EA is provided to a NAND gate 100 of the bank to be selected, for example, the bank BA. The signal from the NAND gate 100 is inverted by means of inverter 102, the output of which is provided to the gate of N channel transistor 104 and input to a NAND gate 106. The transistor 104 is in series with N channel transistor 108 and P channel transistor 109, with transistor 109 connected to Vcc and transistor 104 connected to ground. The node A between the transistors 108, 110 is connected to a latch 112 and also to an input to the NAND gate 106. With the signal to the gate of the transistor 108 low, and with the signal RSTB to the gate of the transistor 109 low, an address signal to the NAND gate 100 provides a low output therefrom which is inverted to a high output applied to the gate of the transistor 104 and input to the NAND gate 106. The node A is high, causing the output on line WSELA of the latch 112 to be low. At the same time, the node A provides a high signal to the NAND gate 106, providing a low output from the NAND gate 106 which is inverted by inverter 114 to provide a high output on line RSELA. To reverse these outputs, so that line WSELA is high and line RSELA is low, the input to the gate of transistor 108 is pulsed while the input signal RSTB is taken high so that node A is driven low, causing line WSELA to go high and line RSELA to go low. Each of the signals on lines WSELA, RSELA is provided to each of the select decoders SA1D-SA8D, each of the signals on lines WSELB, RSELB, is provided to each of the select decoders SB1D, SB8D, etc. The select decoders SA1D-SA8D, SB1D-SB8D are similar in configuration and will be described with reference to FIGS. 4 and 5.

FIG. 3 illustrates the array 50 of FIG. 1 with line RSELA high and line WSELA low, selecting bank BA and providing a read select signal to each of the sector decoders SA1D-SA8D (it is understood that the term "write" may include writing and erasing). Meanwhile, the signals on the lines R1, R2, R3 (read address), are provided as 111 respectively while the signals on the lines W1, W2, W3 (write address) are provided as 000 respectively. The select decoder SA8D includes AND gate 8120 and AND gate 8122 in parallel. The lines RSELA, R1A, R2A and R3A provide input signals to the AND gate 8120, while lines WSELA, W1A, W2A and W3A provide input signals to the AND gate 8122. The outputs of the AND gates 8120, 8122 are provided as inputs to NOR gate 8124, the output of which in turn is provided to inverter 8126. The output from the inverter 8126 is provided to the sector SA8. In the present example, and as illustrated also in FIG. 4, lines RSELA, R1A, R2A and R3A are high, providing a high output from AND gate 8120, while lines WSELA, W1A, W2A and W3A are low, providing a low output from AND gate 8122. This provides a low output from NOR gate 8124 and a high output from inverter 8126, so that a high (read address) signal is provided to sector SA8. Meanwhile, and with reference to FIG. 5, the high signal on line RSELA is provided to AND gate 7120 of sector decoder SA7B, while high signals on lines R1A, R2A are provided to AND gate 7120. As shown, the signal on line R3A is inverted by inverter 7128, and the output from inverter 7128 is input to AND gate 7120. The outputs of both AND gates 7120, 7122 are low, so the output from NOR gate 7124 is high and the output from inverter 7126 is low, so that a read address signal is not provided to sector SA7.

FIG. 6 illustrates the array of FIG. 3 again with line RSELA high and line WSELA low, selecting bank BA and providing a read select signal to each of the sector decoders SA1D-SA8D. Meanwhile, the signals on the lines R1, R2, R3 (read address), are provided as 110 respectively while the signals on the lines W1, W2, W3 (write address) are provided as 000 respectively. As described above, the lines RSELA, R1A, R2A and R3A provide input signals to the AND gate 8120, while lines WSELA, W1A, W2A and W3A provide input signals to the AND gate 8120. In this example, and as illustrated also in FIG. 7, lines RSELA, R1A, and R2A are high, while line R3A is low, providing a low output from AND gate 8120, while lines WSELA, W1A, W2A and W3A are low, providing a low output from AND gate 8122. This provides a high output from NOR gate 8124 and a low output from inverter 8126, so that a read address signal is not provided to sector SA8. Meanwhile, and with reference to FIG. 8, the high signal on line RSELA is provided to AND gate 7120 of sector decoder SA7B, while high signals on lines R1A, R2A are provided to AND gate 7120. The low signal on line R3A is inverted by inverter 7128, and the output from inverter 7128 is input to AND gate 7120. The output of AND gate 7120 is high, while the output of AND gate 7122 is low, so the output from NOR gate 7124 is low and the output from inverter 7126 is high, so that a read address signal is provided to sector SA7.

It will be understood that the other sector decoders include appropriately placed inverters (similar to inverter 7128) so that only one sector at a time is provided with a read or write address signal.

As will be seen with reference to FIGS. 1, 3 and 6, the pluralities of lines RA and WA, RB and WB, etc. extend and lie within the area of the memory banks between adjacent columns of sectors (for example, plurality of lines RA and plurality of lines WA lie between the column of sectors SA1-SA8 and the column of sectors SB1-SB8. These lines, included across the device between each pair of adjacent columns of sectors, take up substantial area of the finally produced die, causing the die to be large in area. As is well understood, reduction in die size for a given devices highly desirable. The problem is increased when the number of sectors in a column is increased. For example, has pointed out above, a column of 16 sectors would require four read address lines and four write address lines rather than the three read address lines and three write address lines as shown in the present example.

Therefore, what is needed is an approach wherein proper addressing up sectors in a memory array may be undertaken, meanwhile using an approach which reduces die size as compared to the prior art.

DISCLOSURE OF THE INVENTION

Broadly stated, the present memory array comprises a plurality of memory banks, each comprising a plurality of sectors and a plurality of sector decoders, each sector decoder operatively associated with a sector, a plurality of lines for providing signals, and apparatus operatively associated with the plurality of lines for receiving the signals and providing an address signal to a sector decoder by means of a number of lines which is less than the number of lines in the plurality of lines.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 9:
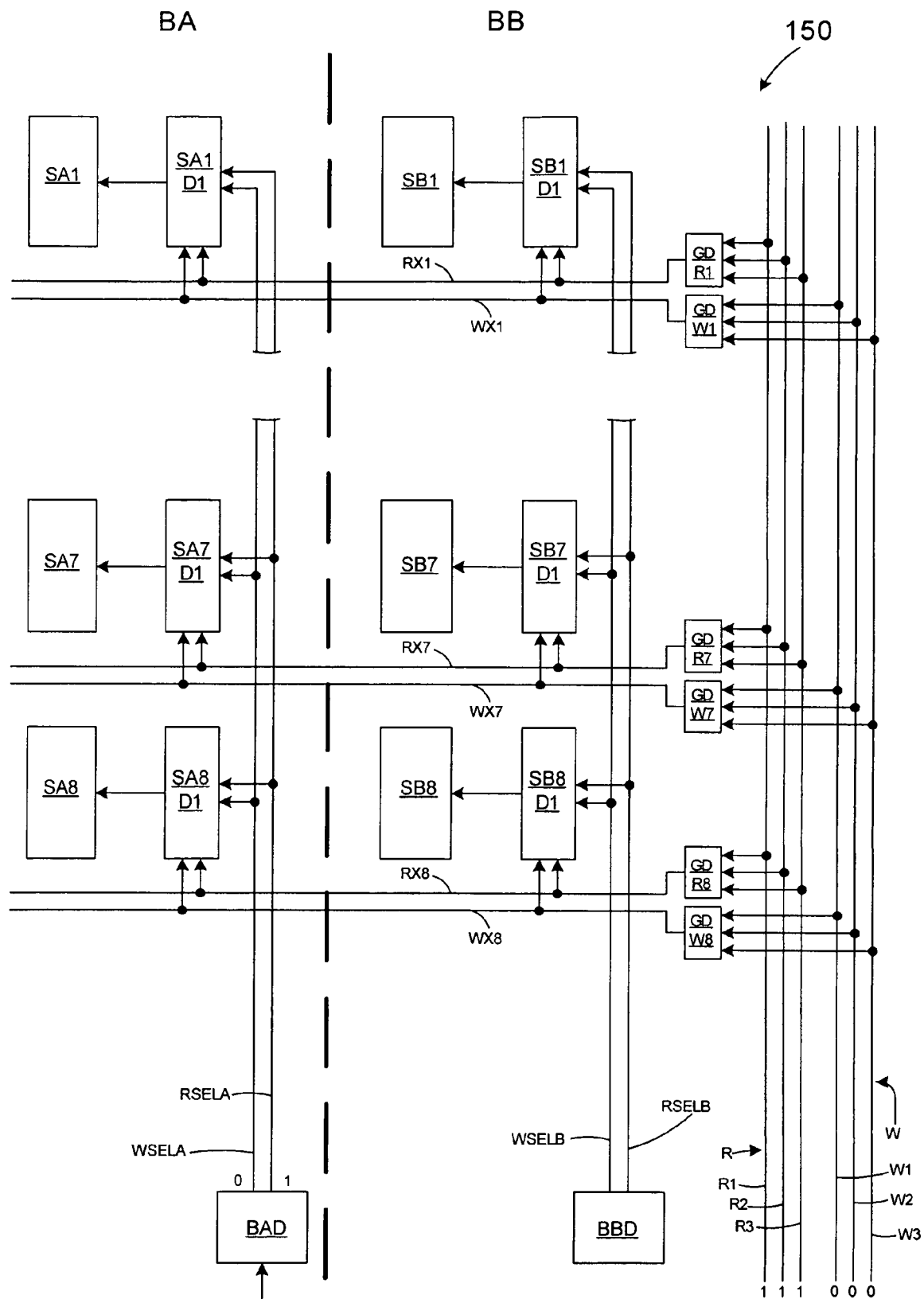
FIG. 9 is a schematic illustration of the present memory array, illustrating operation thereof.

FIG. 9 illustrates the present flash memory array 150. Similar to memory array 50, the memory array 150 includes a plurality of memory banks (shown are banks BA and BB of a large number of memory banks). Each memory bank includes a plurality of sectors arranged in a column. That is, memory bank BA includes sectors SA1-SA8 arranged in a column, memory bank BB includes sectors SB1-SB8 arranged in a column, and so forth. These columns of sectors are in parallel relation as illustrated FIG. 9. Each sector is operatively associated with a sector decoder as shown. For example, in memory bank BA, sector decoder SA1D1 is operatively associated with sector SA1, etc., while in memory bank BB, sector decoder SB1D1 is operatively associated with sector SB1, etc.

At the side of the array 150 and outside the area of the memory banks BA, BB are a plurality of read address lines R (including lines R1, R2, R3) and a plurality of write address lines W (including lines W1, W2, W3), the lines R1, R2, R3, W1, W2, W3 being parallel. The read address lines R1, R2, R3 communicate with operational decoders GDR1-GDR8, while the write address lines W1, W2, W3 communicate with operational decoders GDW1-GDW8, the operational decoders GDR1-GDR8 and GDW1-GDW8 also being outside the area of the memory banks BA, BB. Extending from the respective operational decoders GDR1-GDR8 into and within the area of the memory banks BA, BB are lines RX1-RX8, each line RX1-RX8 being a single line extending perpendicular to each column of sectors. Extending from the respective operational decoders GDW1-GDW8 into and within the area of the memory banks BA, BB are lines WX1-WX8, each line WX1-WX8 being a single line extending perpendicular to each column of sectors. Each of the lines RX1-RX8 communicates with sector decoders as illustrated in FIG. 9, i.e., for example, line RX8 communicates with sector decoders SA8D1, SB8D1, line RX7 communicates with sector decoders SA7D1, SB7D1, etc. Likewise, each of the lines WX1-WX8 communicates with sector decoders as illustrated in FIG. 9, i.e., for example, line WX8 communicates with sector decoders SA8D1, SB8D1, line WX7 communicates with sector decoders SA7D1, SB7D1, etc.

It will again be understood that while the present embodiment illustrates eight sectors in each bank, along with three read address lines R1, R2, R3 (capable of providing eight digital addresses) and three write address lines W1, W2, W3 (capable providing eight digital addresses), these numbers are chosen for illustrative purposes only and, for example, each bank may include more than eight sectors, for example 16 sectors which would be associated with four read address lines (for providing 16 digital addresses) and four write address lines (for providing 16 digital addresses).

Figure 1:
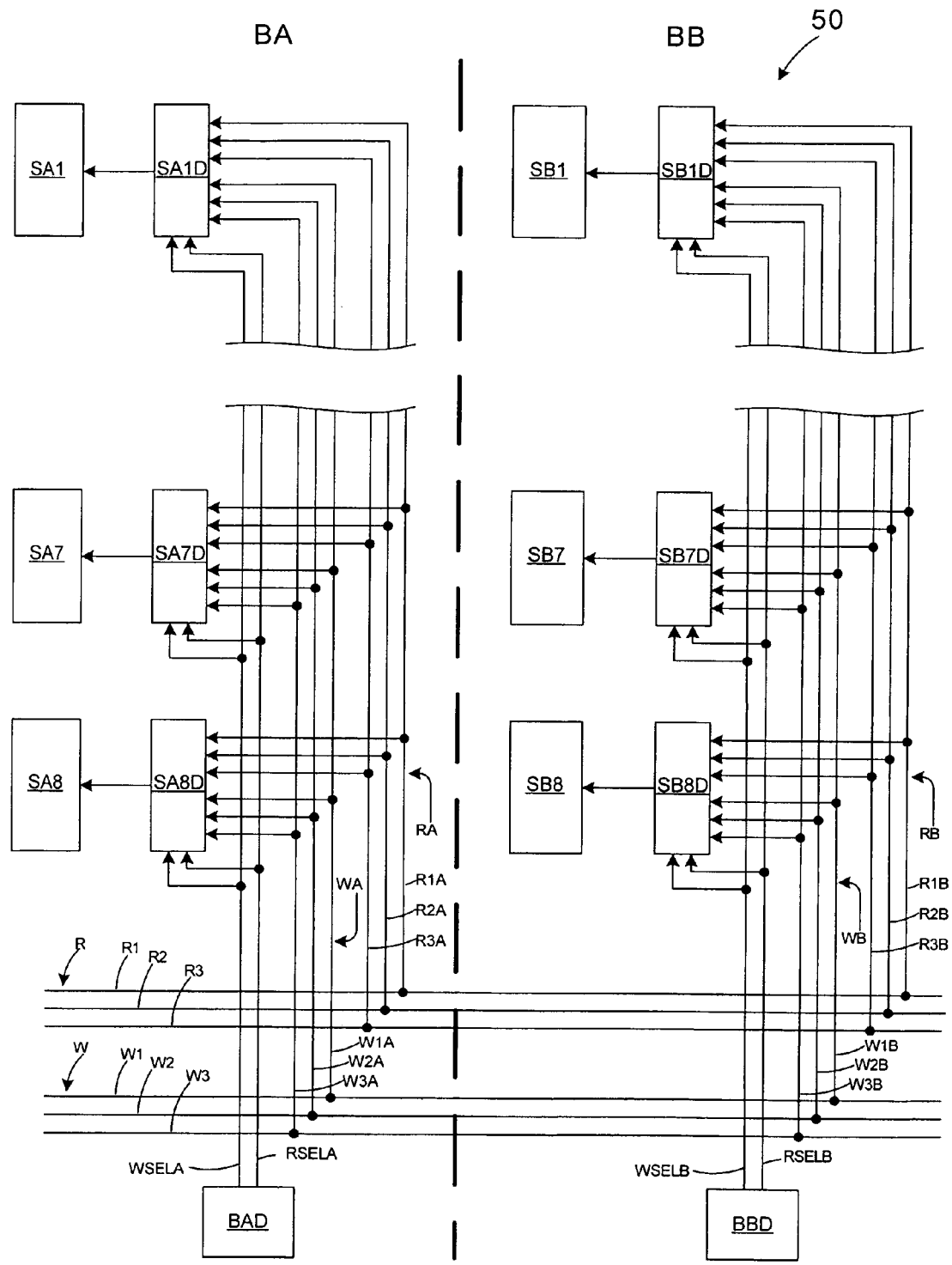
FIG. 1 is a schematic illustration of a memory array of the prior art.
Figure 2:
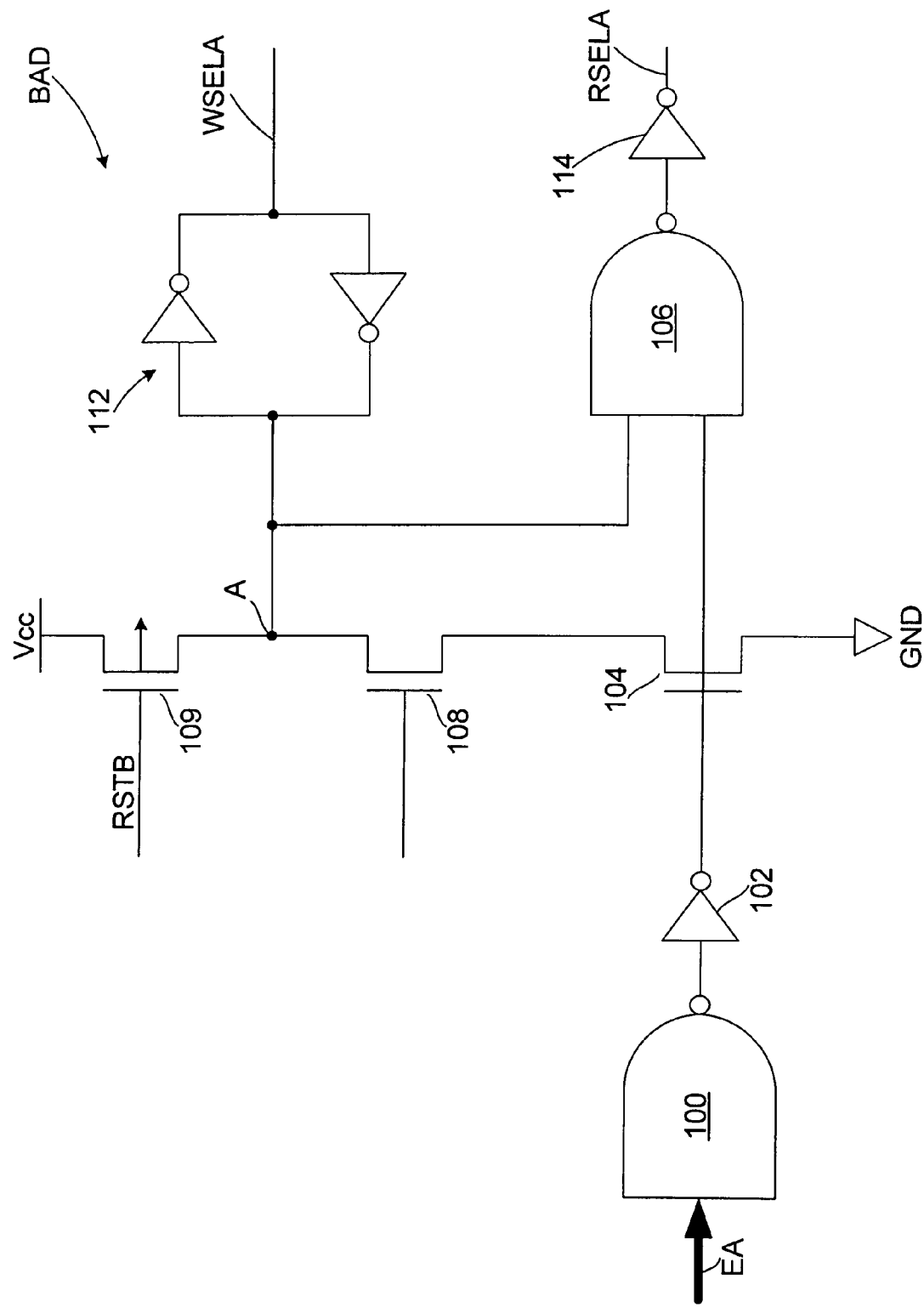
FIG. 2 is a schematic illustration of a bank select circuit of the memory array of FIG. 1.
Figure 3:
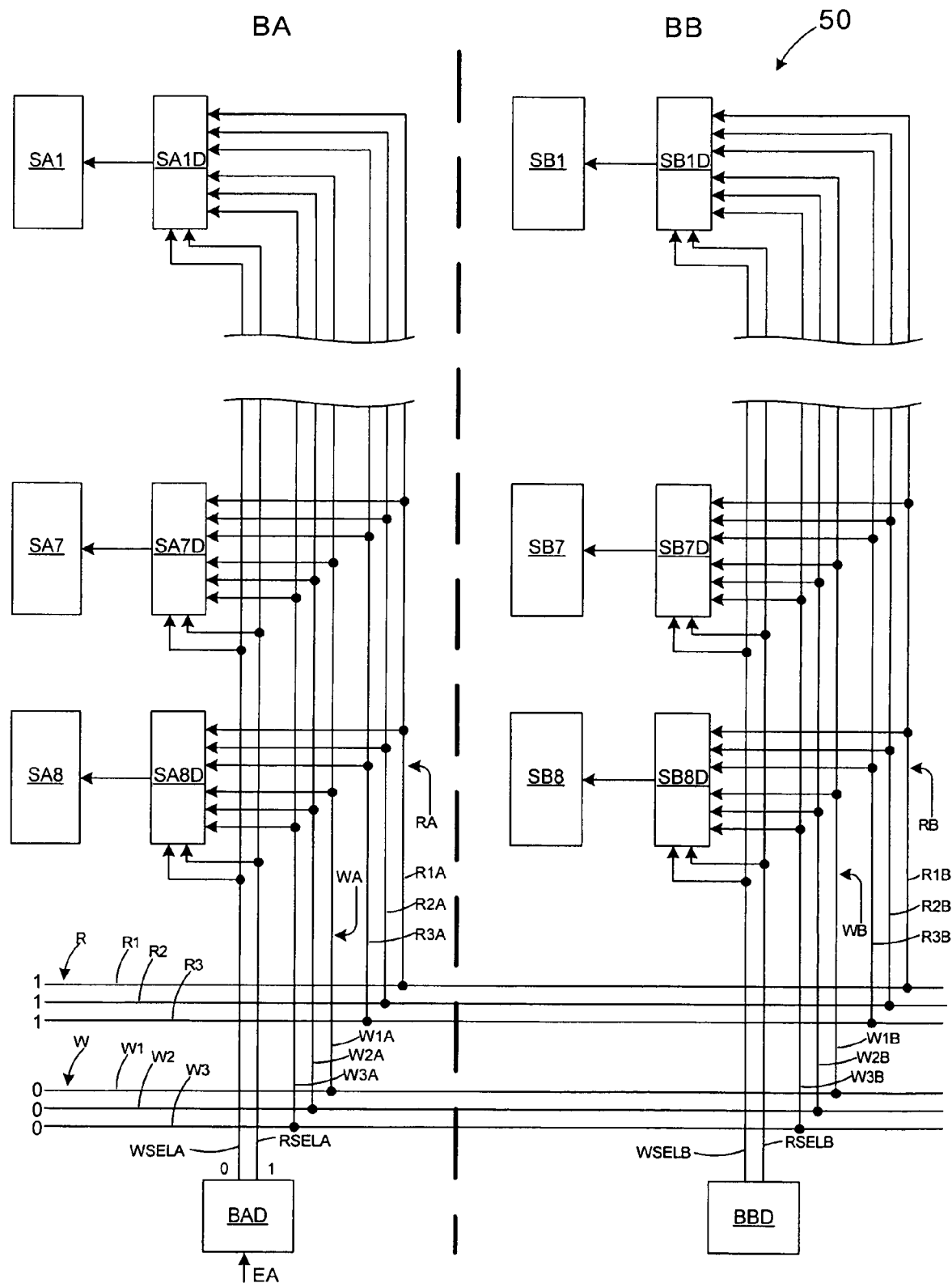
FIG. 3 is a schematic illustration of the memory array of FIG. 1, illustrating operation of the array.
Figure 4:
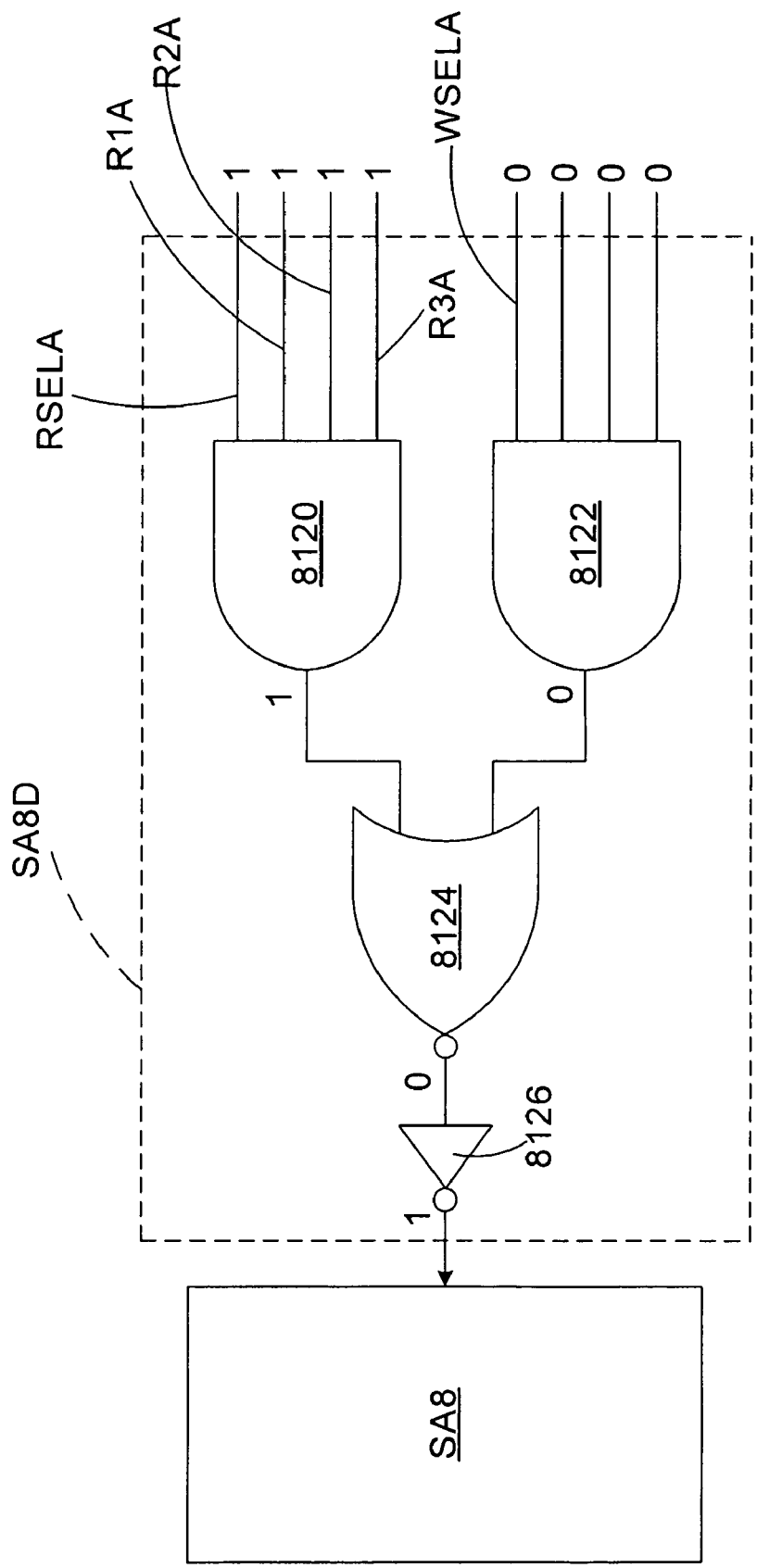
FIG. 4 is a schematic illustration of a sector decoder of the memory array of FIGS. 1 and 3, illustrating operation thereof.
Figure 5:
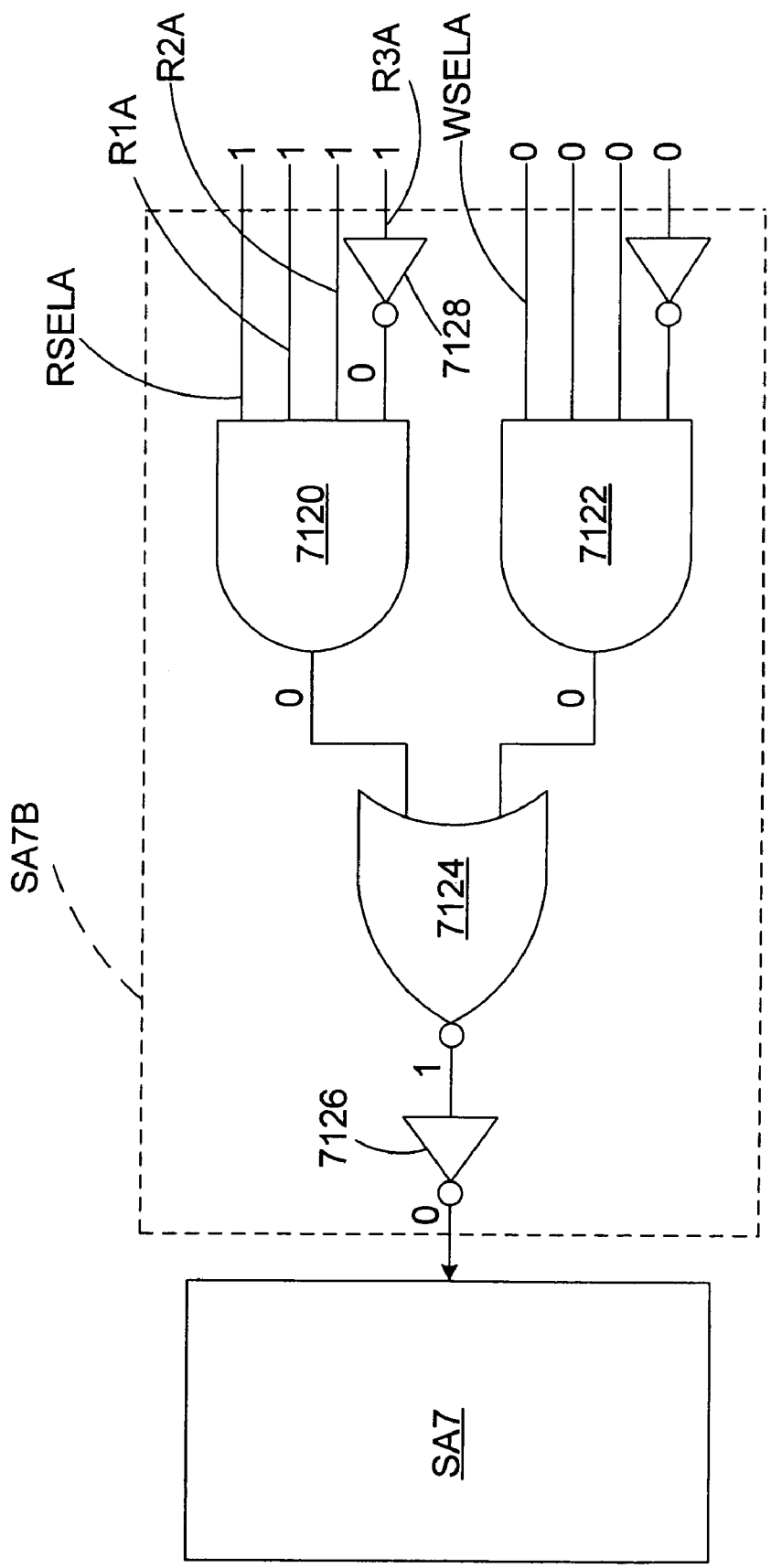
FIG. 5 is a schematic illustration of another sector decoder of the memory array of FIGS. 1 and 3, illustrating operation thereof.
Figure 6:
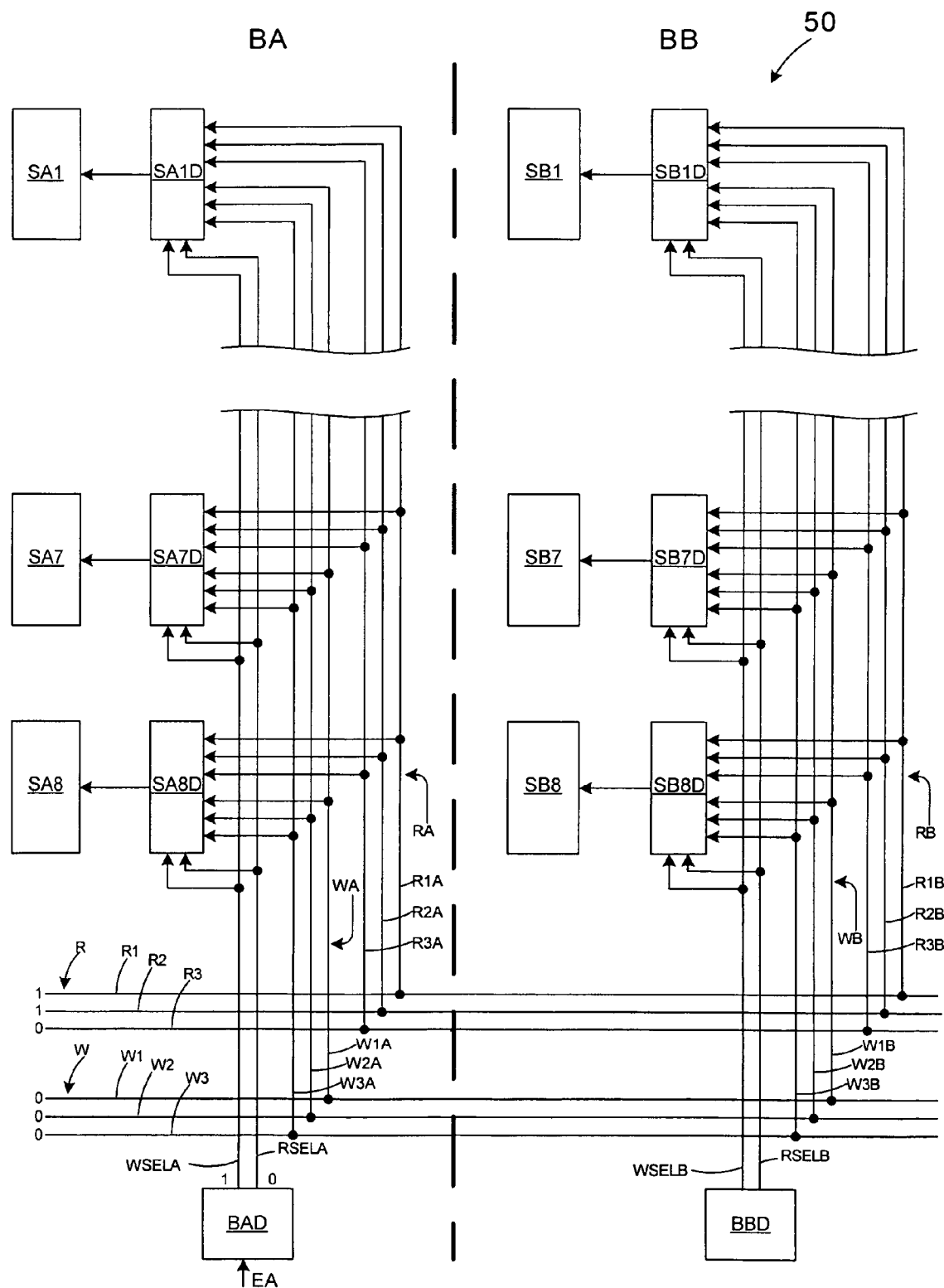
FIG. 6 is a schematic illustration of the memory array of FIG. 1, illustrating further operation of the array.
Figure 7:
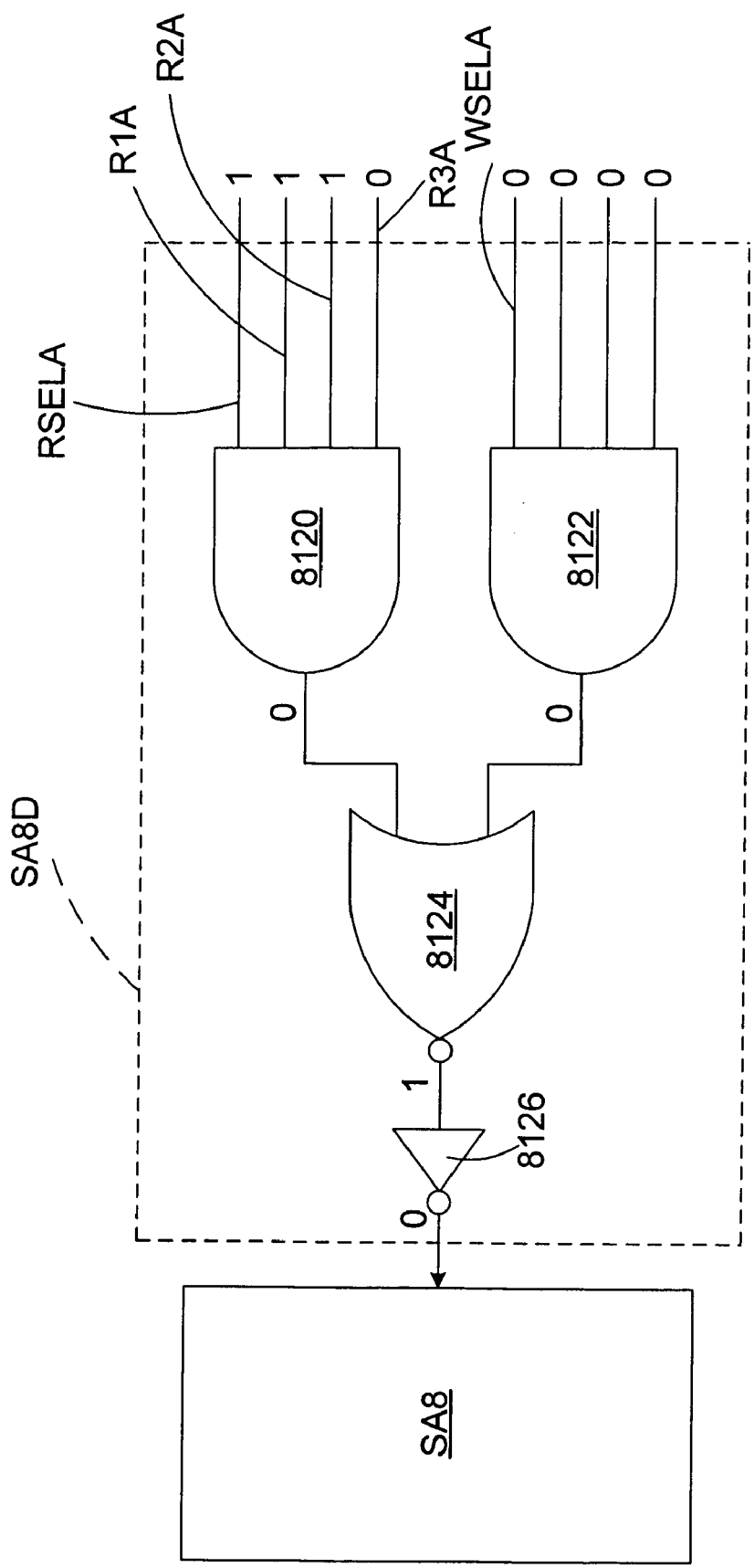
FIG. 7 is a schematic illustration of the sector decoder of FIG. 4, illustrating further operation thereof.
Figure 8:
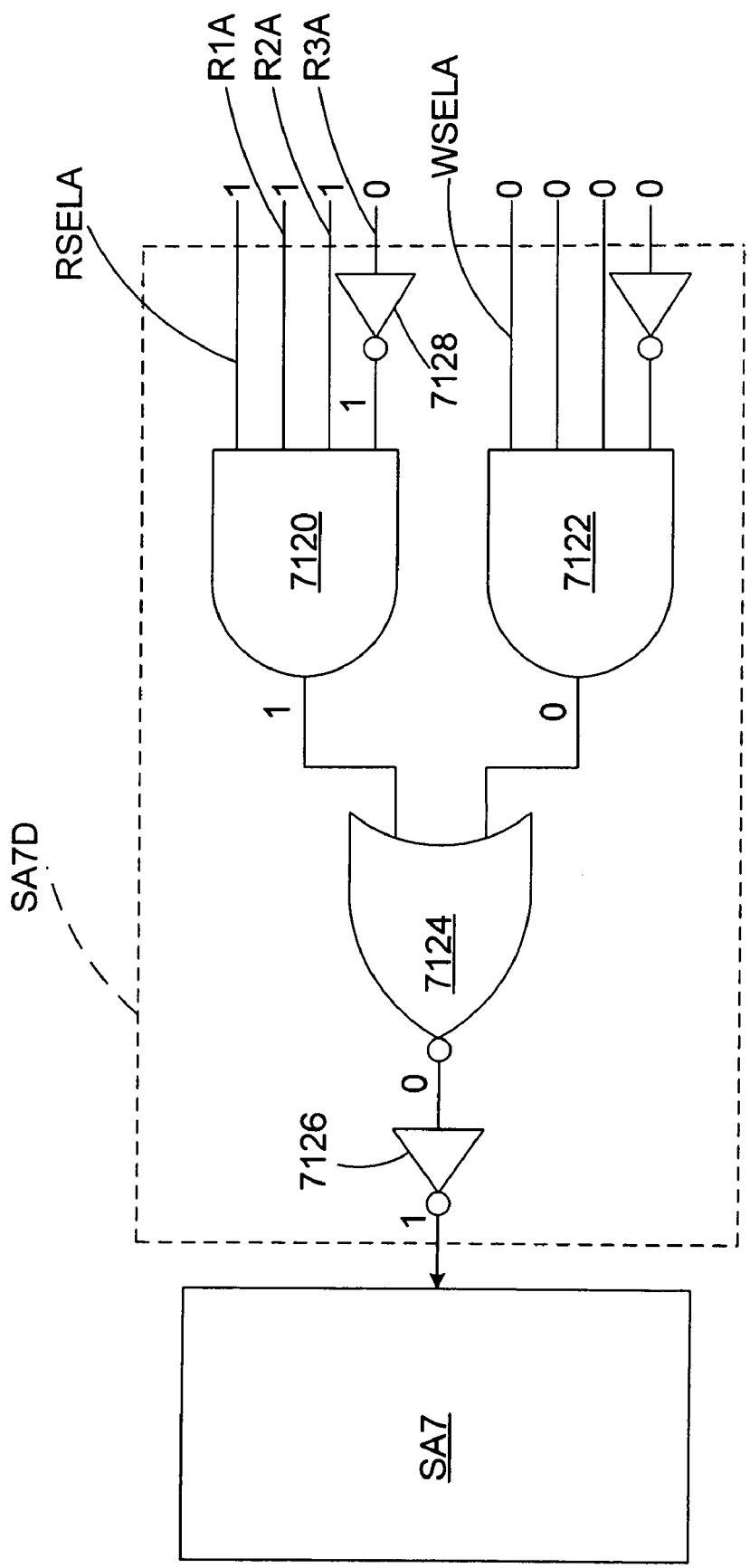
FIG. 8 is a schematic illustration of the sector decoder of FIG. 5, illustrating further operation thereof.

Each of the select decoders BAD, BBD is the same as that illustrated in FIG. 2, and operates in the same manner.

Figure 10:
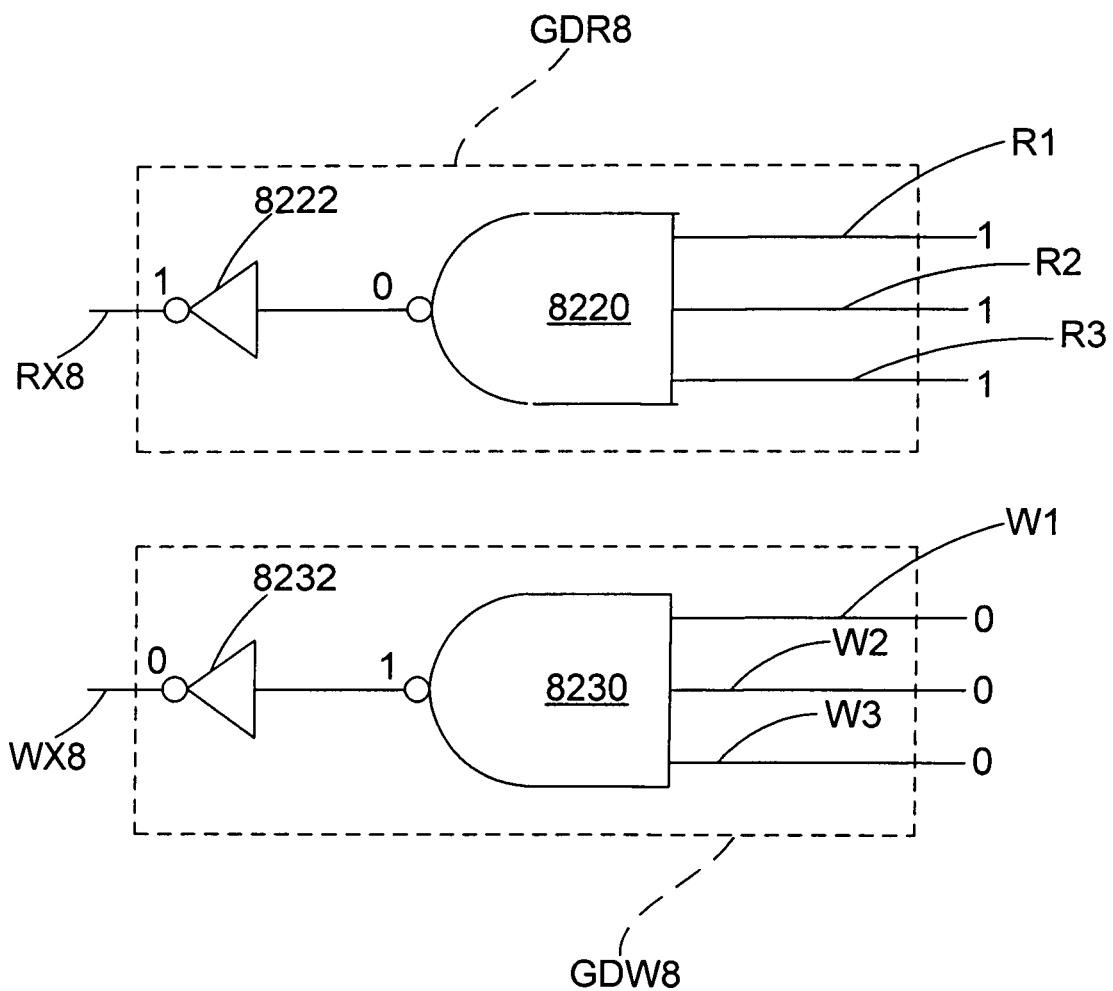
FIG. 10 is a schematic illustration of a set of operational decoders of the memory array of FIG. 9, illustrating operation thereof.

FIG. 9 illustrates the array 150 with line RSELA high and line WSELA low, selecting bank BA and providing a read select signal to each of the sector decoders SA1D1-SA8D1 (it is understood that the term "write" may include writing and erasing). Meanwhile, the signals on the lines R1, R2, R3 (read address), are provided as 111 respectively while the signals on the lines W1, W2, W3 (write address) are provided as 000 respectively. With reference to FIG. 10, the operational decoder GDR8 includes NAND gate 8220 and inverter in 8222 series. The lines R1, R2 and R3 provide input signals to the NAND gate 8220. The operational decoder GDW8 includes NAND gate 8230 and inverter 8232 in series while lines W1, W2 and W3 provide input signals to the NAND gate 8230. The outputs of the inverters 8222, 8232 are provided on the lines RX8, WX8 respectively. In the present example, and as illustrated also in FIG. 10, lines R1, R2 and R3 are high, providing a low output from NAND gate 8220 and a high (read address) output on line RX8, while lines W1, W2 and W3 are low, providing a high output from NAND gate 8230 and a low (write address) output on line WX8.

Figure 11:
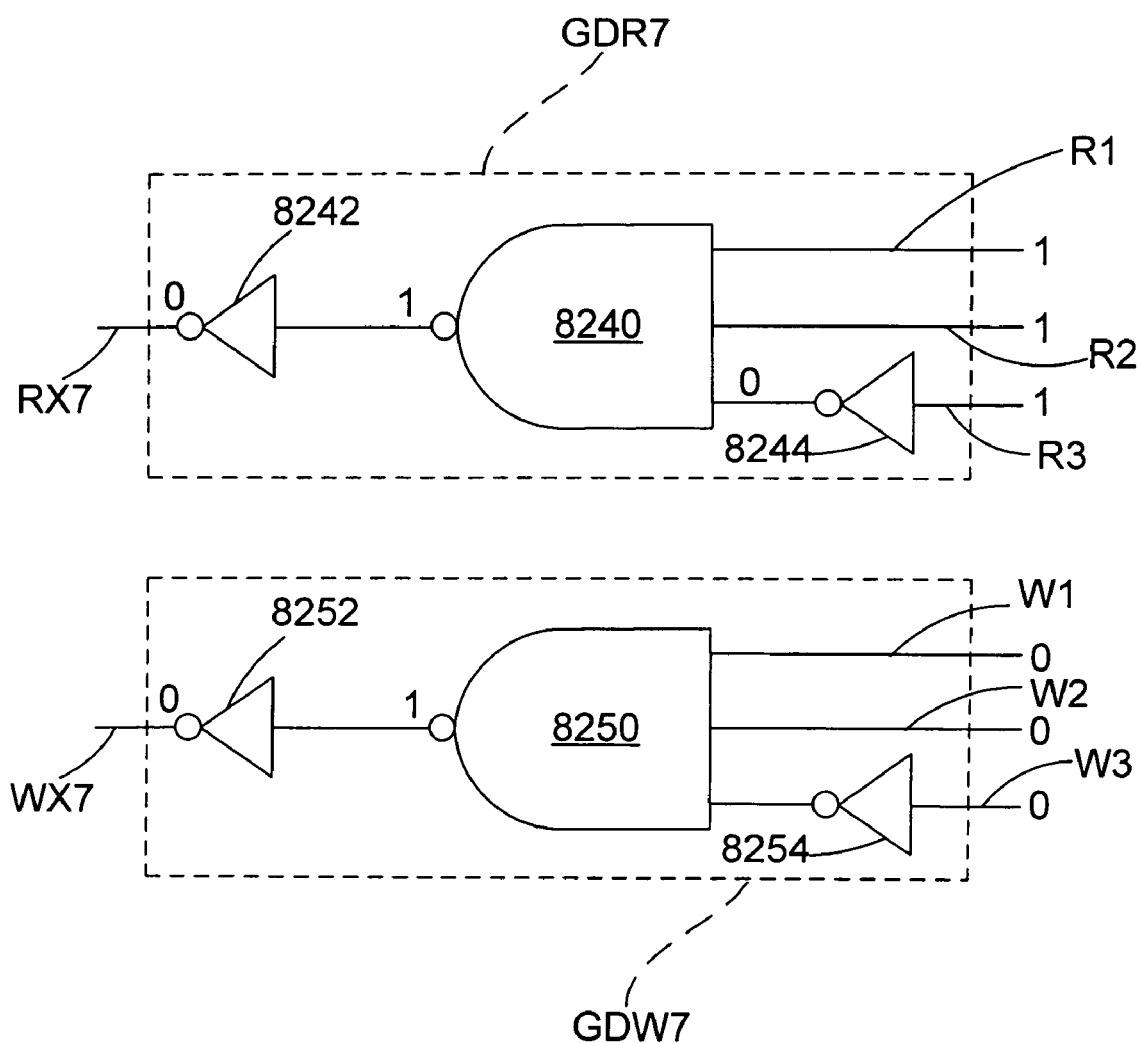
FIG. 11 is a schematic illustration of another set of operational decoders of the memory array of FIG. 9, illustrating operation thereof.

With reference to FIG. 11, the operational decoder GDR7 includes NAND gate 8240 and inverter 8242 in series. The lines R1, R2 provide input signals to the NAND gate 8240, while the line R3 provides an input signal to an inverter 8244, the output of which is input to the NAND gate 8240. The operational decoder GDW7 includes NAND gate 8250 and inverter 8252 in series. Lines W1, W2 provide input signals to the NAND gate 8250, while the line W3 provides an input signal to an inverter 8254, the output of which is input to the NAND gate 8250. The outputs of the inverters 8242, 8252 are provided on the lines RX7, WX7 respectively. In the present example, and as illustrated also in FIG. 11, a high output is provided from NAND gate 8240 and a low (read address) output is provided on line RX7, while a high output is provided from NAND gate 8250 and a low (write address) output is provided on line WX7.

Figure 12:
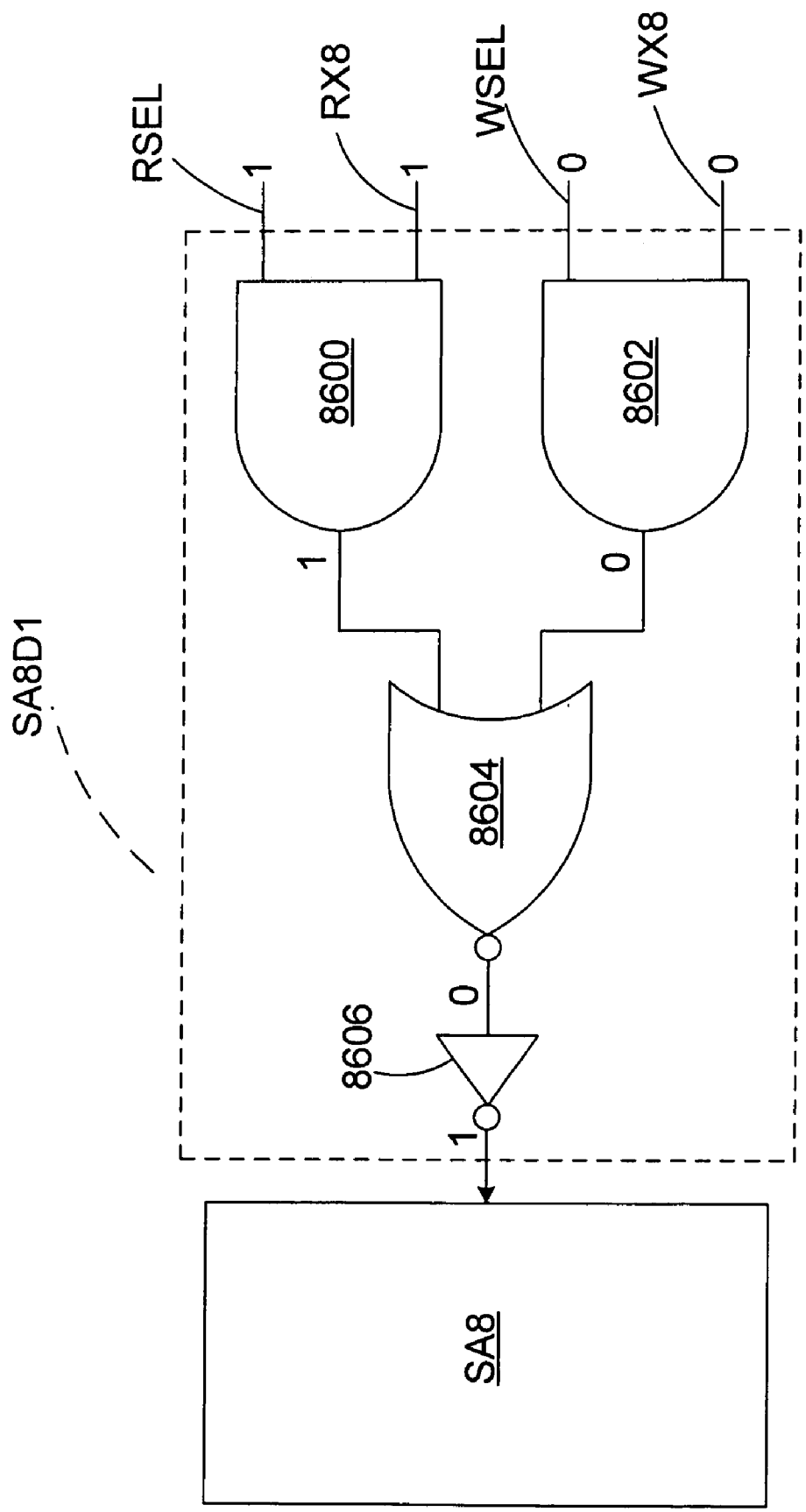
FIG. 12 is a schematic illustration of a sector decoder of the memory array of FIG. 9, illustrating operation thereof.

Each of the sector decoders of the array 150 is identical in configuration, and will be described with reference to FIG. 12. As illustrated, sector decoder SA8D1 includes AND gates 8600, 8602 in parallel, the outputs of which are provided as inputs to a NOR gate 8604, the output of which is inverted by inverter 8606 and provided to sector SA8. The signal on the line RSEL and the signal on line RX8 are provided as inputs to the AND gate 8600. The signal on the line WSEL and the signal on line WX8 are provided as inputs to the AND gate 8602. In the present example, with RSEL and RX8 high, and with WSEL and WX8 low, the output of NOR gate 8604 is low and the output of inverter 8606 (provided to sector SA8) is high, so that a read address is provided to sector SA8.

Figure 13:
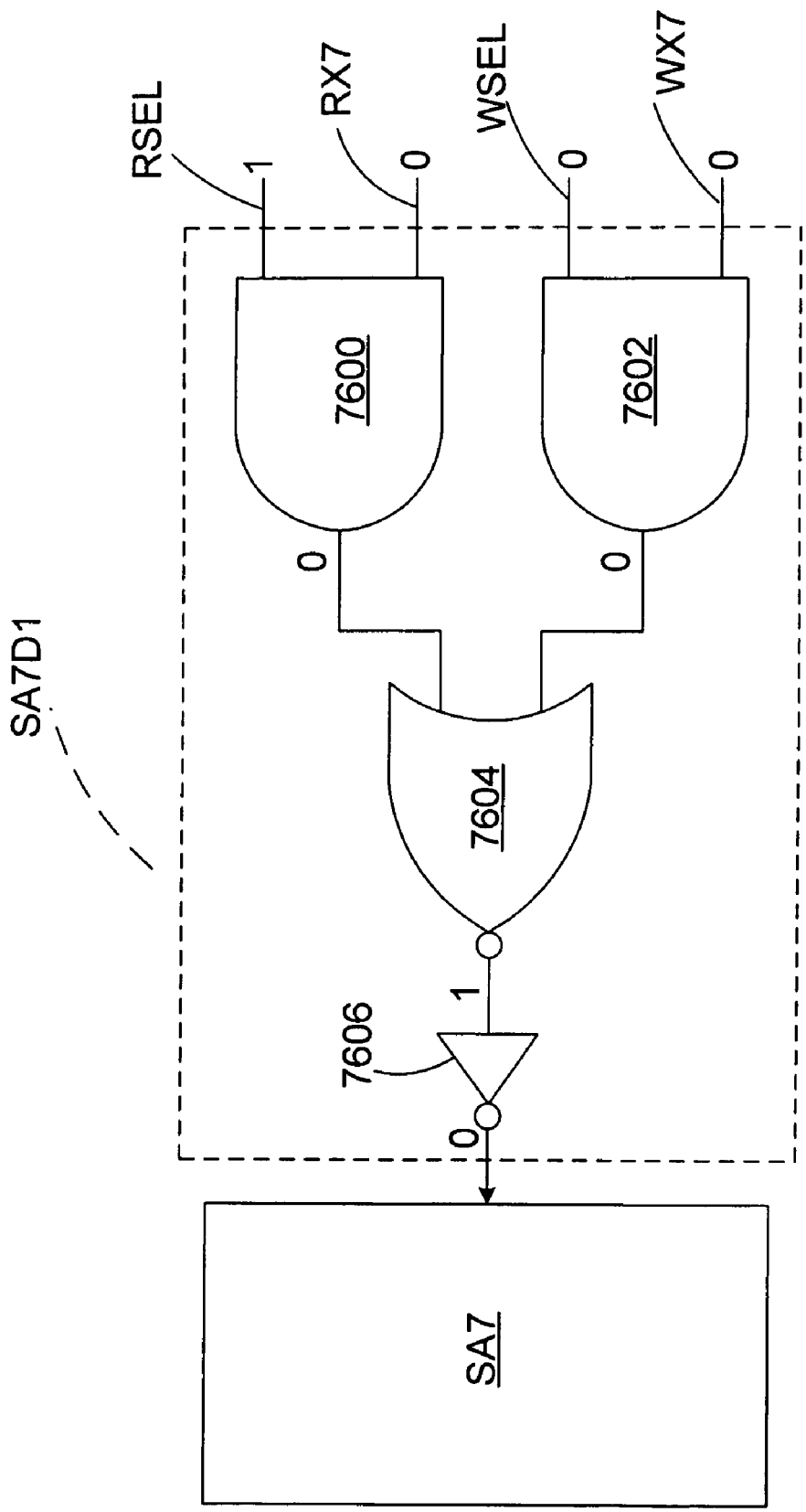
FIG. 13 is a schematic illustration of another sector decoder of the memory array of FIG. 9, illustrating operation thereof.

At the same time, and with reference to FIG. 13, with RSEL high and RX7 low, and with WSEL and WX7 low, the output of NOR gate is high and the output of inverter 7606 (provided to sector SA7) is low, so that a read address is not provided to sector SA7.

Figure 14:
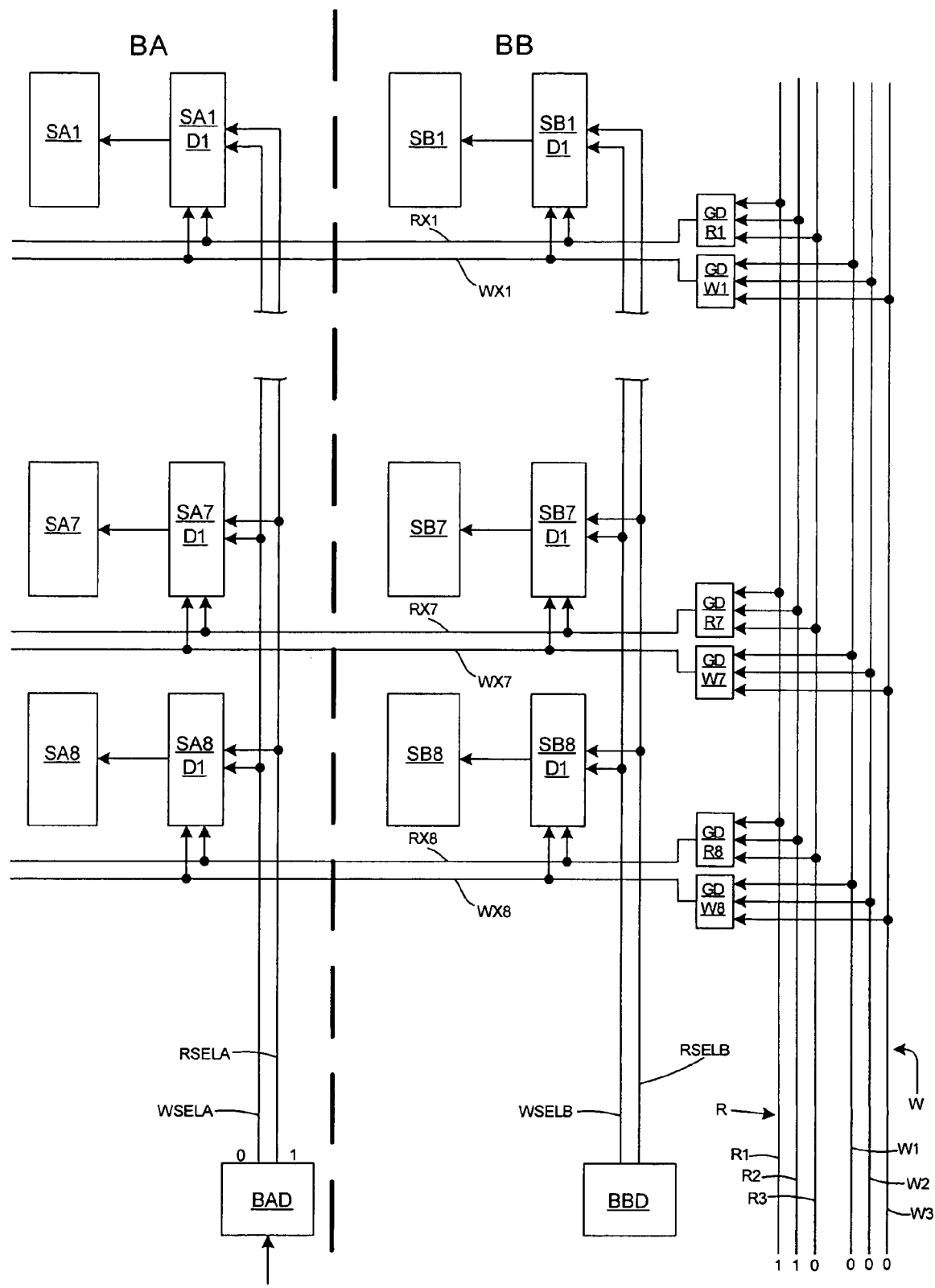
FIG. 14 is a schematic illustration of the present memory array, illustrating further operation thereof.
Figure 15:
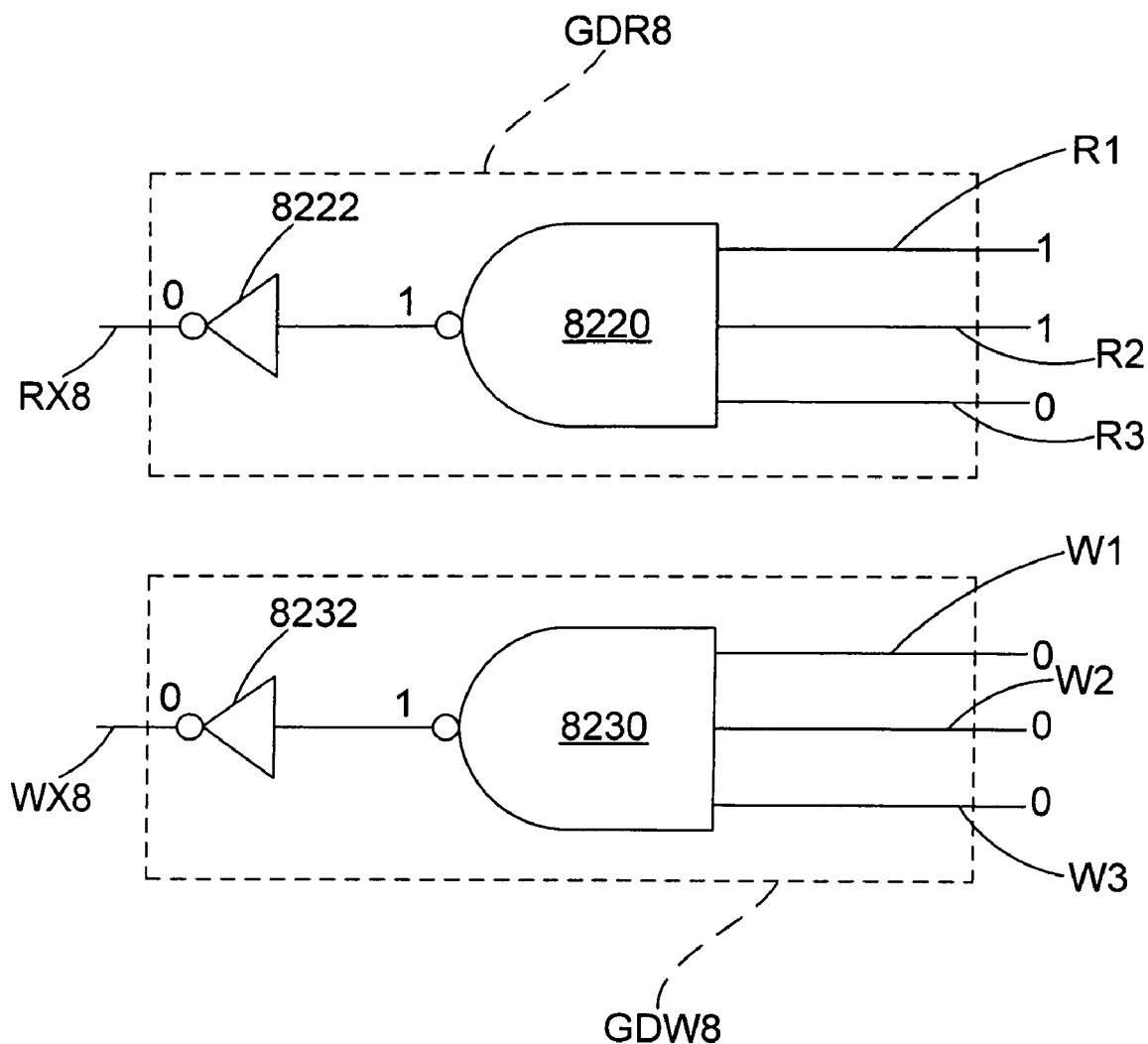
FIG. 15 is a schematic illustration of the set of operational decoders of FIG. 10, illustrating further operation thereof.

FIG. 14 illustrates the array 150 with line RSELA high and line WSELA low, selecting bank BA and providing a read select signal to each of the sector decoders SA1D1-SA8D1. Meanwhile, the signals on the lines R1, R2, R3 (read address), are provided as 110 respectively while the signals on the lines W1, W2, W3 (write address) are provided as 000 respectively. With reference to FIG. 15, lines R1, R2 are high, while line R3 is low, providing a high output from NAND gate 8220 and a low (read address) output on line RX8, while lines W1, W2 and W3 are low, providing a high output from NAND gate 8230 and a low (write address) output on line WX8.

Figure 16:
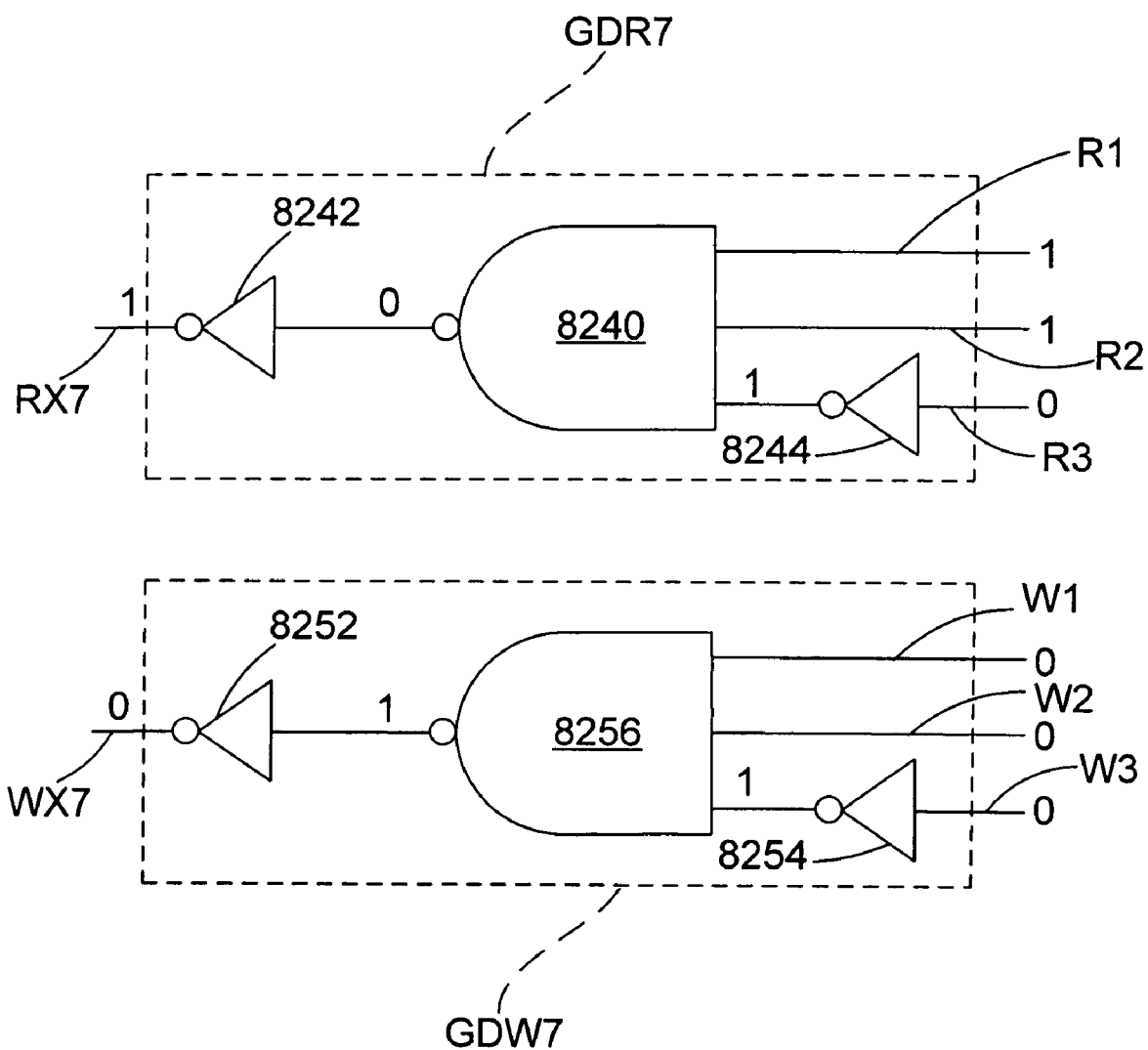
FIG. 16 is a schematic illustration of the set of operational decoders of FIG. 11, illustrating operation thereof.

With reference to FIG. 16, a high low output is provided from NAND gate 8240 and a low (read address) output is provided on line RX7, and a high output is provided from NAND gate 8250 and a low (write address) output is provided on line WX7.

Figure 17:
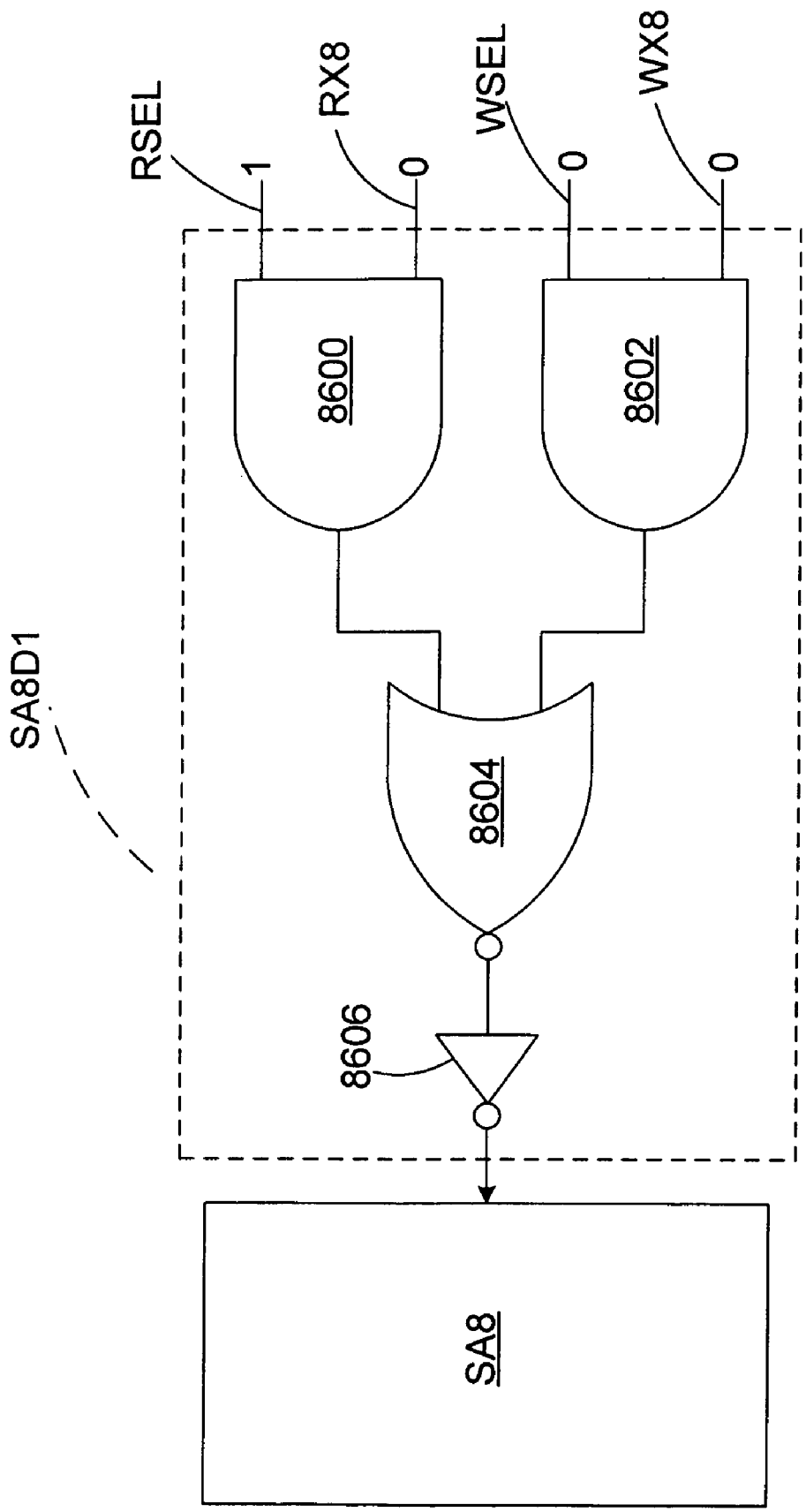
FIG. 17 is a schematic illustration of the sector decoder of FIG. 12, illustrating further operation thereof.
Figure 18:
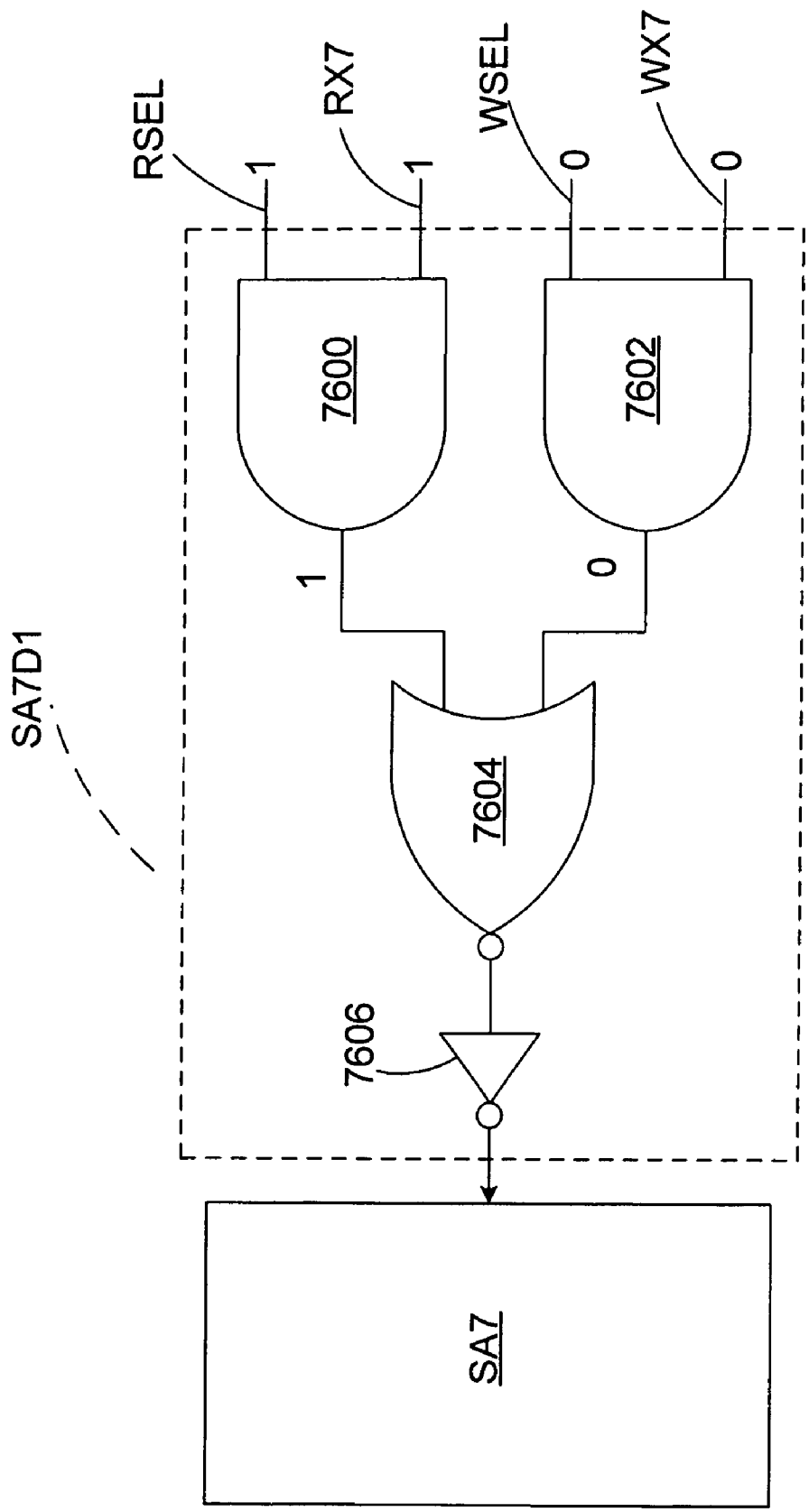
FIG. 18 is a schematic illustration of the sector decoder of FIG. 13, illustrating further operation thereof.

In the present example, and with reference to FIG. 17, with RSEL high and RX8 low, and with WSEL and WX8 low, the output of NOR gate 8604 is high and the output of inverter 8606 (provided to sector SA8) is low, so that a read address is not provided to sector SA8. Furthermore, with reference to FIG. 18, with RSEL and RX7 high, and with WSEL and WX7 low, the output of NOR gate 7604 is low and the output of inverter 7606 (provided to sector SA7) is high, so that a read address is provided to sector SA7.

It will be understood that the other operational decoders include appropriately placed inverters (similar to inverters 8244, 8254) so that only one sector at a time is provided with a read or write address signal.

As will be seen, in this approach, the pluralities of lines extending and lying within the area of the memory banks between adjacent columns of sectors (as in the prior art) do not exist. With these lines removed, the die can be substantially reduced in area, which is highly desirable.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory array comprising:
   a plurality of memory banks, each comprising a plurality of sectors and a plurality of sector decoders, each sector decoder operatively associated with a sector;
   a plurality of lines for providing signals; and
   apparatus operatively associated with the plurality of lines for receiving the signals and providing an address signal to a sector decoder by means of a number of lines which is less than the number of lines in the plurality of lines.

2. The memory array of claim 1 wherein the address signal is provided to the sector decoder by means of a single line.

3. The memory array of claim 1 wherein the plurality of lines is outside the area of the plurality of memory banks.

4. The memory array of claim 3 wherein the single line extends within the area of the plurality of memory banks.

5. The memory array of claim 4 wherein the sectors of each memory bank are arranged in columns, with the columns in parallel relation, and wherein the single line extends within the area of the plurality of memory banks generally perpendicular to each column.

6. The memory array of claim 5 wherein the plurality of lines is a plurality of lines parallel to each column.

7. The memory array of claim 2 wherein the address signal is a read address signal.

8. The memory array of claim 2 wherein the address signal is a write address signal.

9. The memory array of claim 2 and further comprising a plurality of select decoders, each operatively associated with a memory bank, for selecting a memory bank containing the sector decoder to which the address signal is to be provided.

10. The memory array of claim 2 wherein the apparatus operatively associated with the plurality of lines comprises an operational decoder operatively associated with the plurality of lines and the single line.

11. A memory array comprising:
    a plurality of memory banks, each comprising a plurality of sectors and a plurality of sector decoders, each sector decoder operatively associated with a sector;
    a first plurality of lines for providing first signals;
    a second plurality of lines for providing second signals;
    first apparatus operatively associated with the first plurality of lines for receiving the first signals and for providing a first address signal by means of a first single line to a sector decoder of a memory bank; and
    second apparatus operatively associated with the second plurality of lines for receiving the second signals and for providing a second address signal by means of a second single line to a sector decoder of a memory bank.

12. The memory array of claim 11 wherein the first and second pluralities of lines are outside the area of the plurality of memory banks.

13. The memory array of claim 12 wherein the lines of the first and second pluralities of lines are parallel.

14. The memory array of claim 12 wherein the first and second single lines extend within the area of the plurality of memory banks.

15. The memory array of claim 14 wherein the sectors of each memory bank are arranged in columns, with the columns in parallel relation, and wherein the first and second single lines extend within the area of the plurality of memory banks generally perpendicular to each column.

16. The memory array of claim 14 wherein the apparatus operatively associated with the first plurality of lines comprises a first operational decoder operatively associated with the first plurality of lines and the first single line, and wherein the apparatus operatively associated with the second plurality of lines comprises a second operational decoder operatively associated with the second plurality of lines and the second single line.

17. The memory array of claim 16 wherein the first and second operational decoders are outside the area of the plurality of memory banks.

18. The memory array of claim 17 wherein the first operational decoder receives the first signals and outputs a signal on the first single line, and wherein the second operational decoder receives the second signals and outputs a signal on the second single line.

19. The memory array of claim 18 wherein the first address signal is a read address signal, and the second address signal is a write address signal.

20. The memory array of claim 18 and further comprising a plurality of select decoders, each operatively associated with a memory bank, for selecting a memory bank containing a sector decoder to which an address signal is provided.

* * * * *